US008737186B2

(12) United States Patent
Nakagawa

(10) Patent No.: US 8,737,186 B2
(45) Date of Patent: May 27, 2014

(54) LASER HOLDER AND OPTICAL PICKUP PROVIDED WITH SAME

(75) Inventor: Ryotaro Nakagawa, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 15 days.

(21) Appl. No.: 13/292,216

(22) Filed: Nov. 9, 2011

(65) Prior Publication Data

US 2012/0113490 A1    May 10, 2012

(30) Foreign Application Priority Data

Nov. 10, 2010  (JP) ................................. 2010-251452

(51) Int. Cl.
*G11B 7/12*       (2012.01)

(52) U.S. Cl.
USPC ........................................ 369/244.1; 720/689

(58) Field of Classification Search
USPC ............... 720/689; 369/244.1; 372/36, 43.01; 359/390
See application file for complete search history.

(56) References Cited

U.S. PATENT DOCUMENTS

| 5,483,095 | A * | 1/1996 | Kagawa et al. ............... 257/431 |
| 5,912,800 | A * | 6/1999 | Sammakia et al. ............ 361/690 |
| 6,720,581 | B2 * | 4/2004 | Ozawa ............................ 257/81 |
| 6,778,568 | B1 * | 8/2004 | Fukuda et al. .................. 372/36 |
| 2003/0161249 | A1 * | 8/2003 | Kamisada et al. ........ 369/112.23 |
| 2004/0145998 | A1 * | 7/2004 | Kubota ........................... 369/118 |
| 2005/0025030 | A1 * | 2/2005 | Nakamura et al. ........ 369/112.15 |
| 2005/0238074 | A1 * | 10/2005 | Matsushita et al. ......... 372/43.01 |
| 2007/0002718 | A1 * | 1/2007 | Asakawa et al. ............... 369/120 |
| 2007/0014204 | A1 * | 1/2007 | Kasuga et al. .............. 369/44.14 |
| 2007/0165684 | A1 * | 7/2007 | Hamaoka ......................... 372/36 |
| 2007/0171806 | A1 * | 7/2007 | Wade et al. .................... 369/121 |
| 2008/0247431 | A1 * | 10/2008 | Feklistov ......................... 372/34 |
| 2008/0250439 | A1 | 10/2008 | Itoh et al. |
| 2009/0315042 | A1 * | 12/2009 | Nemoto .......................... 257/82 |
| 2010/0078669 | A1 * | 4/2010 | Cho et al. ........................ 257/98 |

FOREIGN PATENT DOCUMENTS

| JP | 2007-012138 | 1/2007 |
| JP | 2008-146785 | 6/2008 |
| JP | 2008-257831 | 10/2008 |
| JP | 2009-026416 | 2/2009 |

OTHER PUBLICATIONS

Office Action dated Oct. 2, 2012, for corresponding Japanese Application No. 2010-251452.
Communication from the European Patent Office dated Feb. 14, 2013 in counterpart application No. 11188524.0.

* cited by examiner

*Primary Examiner* — Thomas Alunkal
(74) *Attorney, Agent, or Firm* — Morgan, Lewis & Bockius LLP

(57) ABSTRACT

A laser holder holds a semiconductor laser that has a metal frame part in which a semiconductor laser chip is mounted on one surface, and a resin part provided so as to surround the semiconductor laser chip. The laser holder is provided with an insertion part into which the semiconductor laser is inserted. The insertion part is provided with an aperture part that allows the resin part of the semiconductor laser inserted into the insertion part to be pushed from the exterior, and a wall surface part against which a reverse surface of the one surface of the metal frame part is pressed in a case where the resin part is pushed from the exterior.

10 Claims, 9 Drawing Sheets

LASER HOLDER AND OPTICAL PICKUP PROVIDED WITH SAME

This application is based on Japanese Patent Application No. 2010-251452 filed on Nov. 10, 2010, the contents of which are hereby incorporated by reference.

BACKGROUND OF THE INVENTION

1. Field of the Invention

The present invention relates to a laser holder for holding a semiconductor laser. The present invention also relates to an optical pickup provided with such a laser holder.

2. Description of Related Art

Optical pickups have conventionally been used for reading information recorded on Blu-Ray discs ("BDs"), digital versatile discs ("DVDs"), compact discs ("CDs"), and other optical disks; and for writing information onto such disks. The optical pickup is provided with a semiconductor laser for directing laser light onto the optical disk.

CAN-package-type and frame-type semiconductor lasers provided to the optical pickup are known in the art. The structure of CAN-package semiconductor lasers is such that a semiconductor laser chip is mounted on a metal stem and protected by a cylindrical metal cap. In order for laser light to be emitted, the cylindrical metal cap has, e.g., a structure in which a glass window is provided, or a structure in which an aperture is formed. Frame-type semiconductor lasers are of a structure in which a semiconductor laser chip is mounted on an upper surface of a plate-shaped metal frame and a resin is outsert-molded so as to enclose the semiconductor laser chip on the metal frame.

When mounted on the optical pickup, the semiconductor laser is sometimes mounted on a laser holder and the laser holder is attached to a base member of the optical pickup. With such a configuration, using a laser holder made of metal enables more heat generated by the semiconductor laser to be dissipated.

The structure of CAN-package semiconductor lasers facilitates secure press-fitting in the laser holder. Accordingly, in the case that a CAN-package semiconductor laser is used, the laser holder and semiconductor laser are caused to make firm contact with each other, and desired heat dissipation performance can be ensured.

Secure press-fitting is also possible when a frame-type semiconductor laser is used, as described in Japanese Patent Application No. 2008-146785. Nevertheless, in the case that a frame-type semiconductor laser is securely press-fitted in a laser holder, the plate-shaped metal frame may deform. In the worst case, the semiconductor laser chip mounted on the metal frame may get dislodged. Even if the semiconductor laser chip does not get dislodged, the performance of the semiconductor laser may be adversely affected.

Accordingly, in the case that a frame-type semiconductor laser is used, an urging member is sometimes used in order to cause the laser holder and the semiconductor laser to make firm contact with each other; e.g., as described in Japanese Patent Application No. 2007-12138. In another configuration example involving the use of a frame-type semiconductor laser, heat-dissipating grease is sometimes used if it is impossible to cause the laser holder and the semiconductor laser to make firm contact with each other.

SUMMARY OF THE INVENTION

Since frame-type semiconductor lasers are advantageous in terms of cost, their use is of high benefit. Nevertheless, a configuration in which an urging member such as that described in Japanese Patent Application No. 2007-12138 is added in order to ensure heat dissipation is undesirable due to the increase in the number of components. Furthermore, in the case that heat-dissipating grease is used in order to ensure heat dissipation, the work load for adjusting or otherwise managing the amount of heat-dissipating grease is increased, which is undesirable.

With the foregoing in view, it is an object of the present invention to provide a laser holder in which a frame-type semiconductor laser is readily installed, and which can ensure heat dissipation performance without an increase in the number of components. Another object of the present invention is to provide an optical pickup that has such a laser holder and that can be manufactured at low cost.

In order to achieve the objects described above, the laser holder of the present invention is a laser holder for holding a semiconductor laser, the semiconductor laser having a metal frame part in which a semiconductor laser chip is mounted on one surface, and a resin part provided so as to surround the semiconductor laser chip, the laser holder characterized in comprising: an insertion part into which the semiconductor laser is inserted; wherein the insertion part is provided with an aperture part that allows the resin part of the semiconductor laser inserted into the insertion part to be pushed from the exterior, and a wall surface part against which a reverse surface of the one surface of the metal frame part is pressed in a case where the resin part is pushed from the exterior.

According to the present aspect, it is possible, through the use of the aperture part, to obtain a state in which the metal frame part of the semiconductor laser is pressed against the wall surface part of the laser holder. Accordingly, if the semiconductor laser is securely bonded to the laser holder in a state in which the metal frame part is pressed against the wall surface part, there will be obtained a laser holder in which the semiconductor laser has been installed with the metal frame part and the laser holder being in firm contact with each other. In other words, in accordance with the present aspect, it is possible to obtain a laser holder in which the semiconductor laser has been installed with the metal frame part and the laser holder being in contact with each other as firmly as if secure press-fitting has been performed, but without the semiconductor laser having been securely press-fitted in the laser holder. Therefore, according to the present aspect, heat dissipation performance can be adequately ensured while using a cost-effective frame-type semiconductor laser. Further advantages are presented in terms of cost and ease of processing during manufacture because there is no need to provide heat-dissipating grease, or indeed plate springs or other urging members to ensure heat dissipation characteristics. Furthermore, the absence of secure press-fitting minimizes the possibility of the semiconductor laser being damaged during assembly.

In the laser holder having the configuration described above, the insertion part is preferably provided with a support part for supporting a distal end of the semiconductor laser inserted into the insertion part. According to this aspect, an improvement in processability is made whereby work can be performed while the semiconductor laser is supported by the support part when the semiconductor laser is to be installed in the laser holder.

The laser holder having the configuration described above may also comprise a plate-shaped part provided with an insertion port of the insertion part; and a projecting part having a space for forming the insertion part together with the insertion port, the projecting part being provided so as to protrude from the plate-shaped part, wherein the aperture part may be formed in a side surface of the projecting part. According to this aspect, having the projecting part be in the shape (external shape) of a cylindrical post ensures application to an optical pickup configured for a CAN-package semiconductor laser to be directly mounted, which is convenient as a cost-reducing measure.

In the laser holder of the above aspect, the insertion part may be provided so that the semiconductor laser enters from an insertion port and a pushing member for pushing the resin part from the exterior enters via the aperture part. In this case, the aperture part is preferably provided in a position facing the insertion port of the insertion part. According to the present aspect, in the case that a frame-type semiconductor is used, heat can be sufficiently dissipated and the semiconductor laser will be readily installed in the laser holder.

In the laser holder of the configuration described above, a concave part to be filled with an adhesive is preferably formed on a peripheral edge of the insertion port of the insertion part. If a location to be filled by the adhesive is provided in advance, as in the present aspect, the work for installing the semiconductor laser in the laser holder will be facilitated.

In the laser holder of the configuration described above, a convex part may be formed on a side facing the wall surface part on the peripheral edge of the insertion port of the insertion part. In the present configuration, the convex part can guard against dust and the possibility that the performance of the semiconductor laser will be degraded can be reduced.

The optical pickup of the present invention for achieving the objects described above is characterized in comprising the laser holder of the configuration described above. According to the present aspect, heat dissipation performance can also be sufficiently ensured while a low cost semiconductor laser (a frame-type semiconductor laser) is used. In other words, the cost of an optical pickup can be reduced.

The optical pickup of the configuration described above may comprise: a base member on which the laser holder holding the semiconductor laser, and an optical member are mounted; and a metal cover for covering the optical member mounted on the base member, wherein the laser holder and the metal cover may be secured in a state of contact. According to this aspect, it is possible to provide an optical pickup having good heat dissipation characteristics because the heat of the laser holder can be dissipated to the metal cover.

According to the present invention, it is possible to provide a laser holder in which a frame-type semiconductor laser is readily installed, and heat dissipation performance can be ensured without having to increase the number of components. According to the present invention, furthermore, it is possible to provide an optical pickup that has such a laser holder and that can be manufactured at low cost.

DETAILED DESCRIPTION OF PREFERRED EMBODIMENTS

Embodiments of the laser holder and optical pickup used in the present invention are described in detail below with reference to the accompanying drawings.

First Embodiment

Figure 1A:
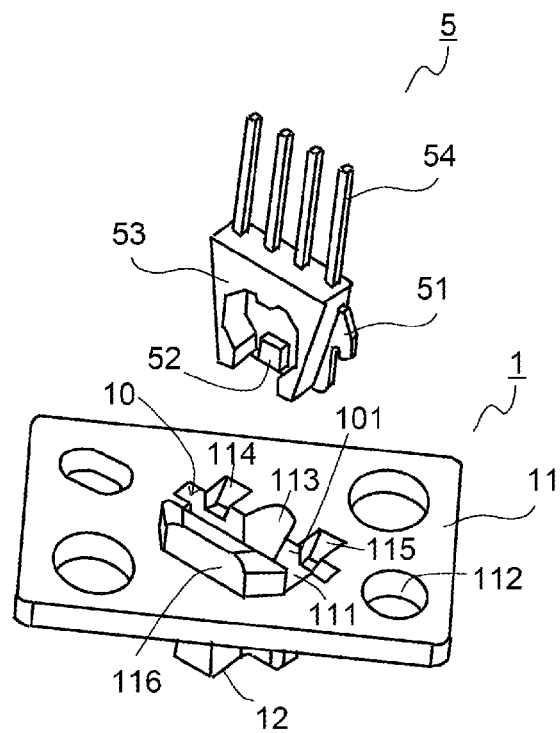
FIG. 1A is a schematic perspective view for illustrating the laser holder of the first embodiment, and shows a state prior to insertion of the semiconductor laser into the laser holder.
Figure 1B:
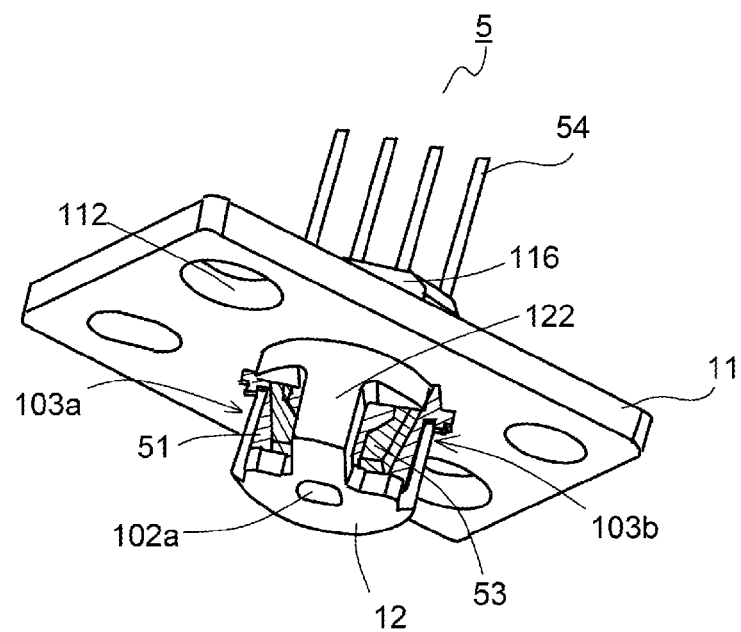
FIG. 1B is a schematic perspective view for illustrating the laser holder of the first embodiment, and shows a state in which the semiconductor laser has been inserted into the laser holder.

FIGS. 1A and 1B are a schematic perspective views for illustrating the laser holder of the first embodiment, wherein FIG. 1A shows a state prior to the semiconductor laser being inserted into the laser holder, and FIG. 1B shows a state in which the semiconductor laser has been inserted into the laser holder.

The semiconductor laser 5 shown in FIGS. 1A and 1B is provided with a plate-shaped metal frame part 51, a semiconductor laser chip 52 mounted on one surface of the metal frame part 51, a resin part 53 molded onto the metal frame part 51 so as to surround the semiconductor laser chip 52; and a plurality of terminal pins 54 secured by the resin part 53 in a state of being electrically connected to the metal frame part 51. The semiconductor laser 5 is referred to a frame-type semiconductor laser. In other words, the laser holder 1 of the first embodiment is a laser holder favorably suited for frame-type semiconductor lasers.

The metal frame part 51 is preferably formed of a metal having good heat dissipation characteristics so that the heat generated by the semiconductor laser chip 52 will be efficiently dissipated. The semiconductor laser chip 52 used in the present embodiment has a light-emitting point for emitting DVD laser light (e.g., laser light in a 650-nm wavelength band); and a light-emitting point for emitting CD laser light (e.g., laser light in a 780-nm wavelength band). However, the above are merely examples; the wavelength of the laser light emitted from the semiconductor laser chip 52 can be suitably changed. The number of light-emitting points in the semiconductor laser chip 52 is not provided by way of limitation in the configuration of the present embodiment, and may also be suitably changed.

The resin part 53 is preferably formed of a resin having high heat resistance so as to be capable of withstanding the heat generated by the semiconductor laser 5. The resin part 53 is provided so as to surround the semiconductor laser chip 52 as described above. In particular, an aperture is provided in a portion of the resin part 53 so that the laser light emitted from the semiconductor laser chip 52 is emitted to the exterior (the aperture is provided to the lower side of the semiconductor laser 5 shown in FIG. 1A). The thickness of the resin part 53 is sufficiently greater than the thickness of the semiconductor laser chip 52 to protect the semiconductor laser chip 52.

Figure 2A:
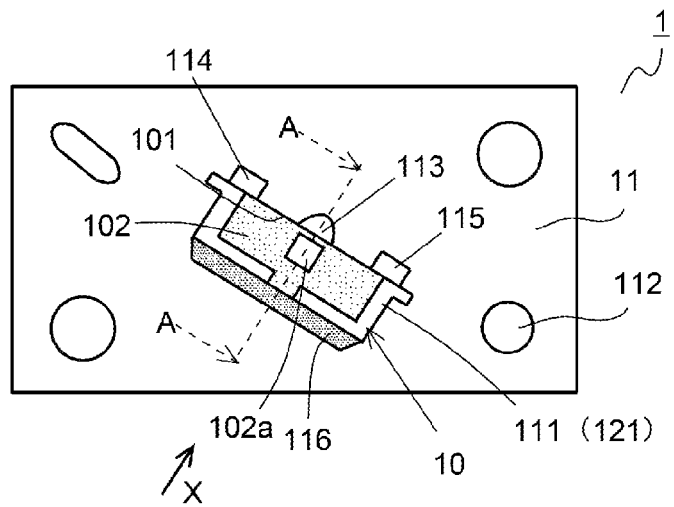
FIG. 2A is a schematic plan view showing the configuration of the laser holder of the first embodiment, as seen from the side in which the semiconductor laser is inserted.
Figure 2B:
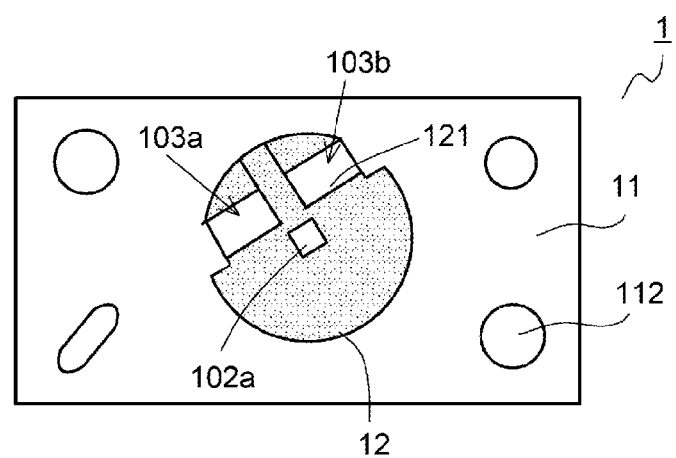
FIG. 2B is a schematic plan view showing the configuration of the laser holder of the first embodiment, as seen from the opposite side of what is shown in FIG. 2A.
Figure 2C:
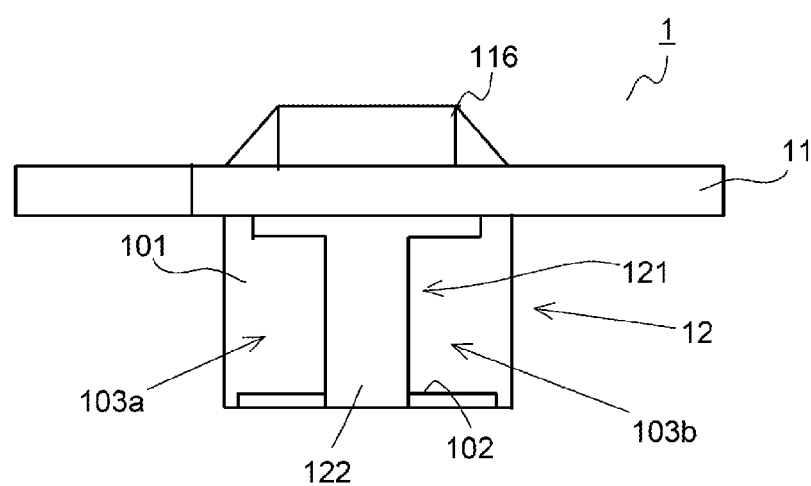
FIG. 2C is a schematic plan view showing the configuration of the laser holder of the first embodiment, as seen along the X direction shown by the arrow in FIG. 2A.

FIGS. 2A, 2B, and 2C are schematic plan views showing the configuration of the laser holder of the first embodiment, wherein FIG. 2A is a view seen from the side in which the semiconductor laser is inserted, FIG. 2B is a view seen from the opposite side of what is shown in FIG. 2A, and FIG. 2C is a view seen along the X direction indicated by the arrow in FIG. 2A. The laser holder 1 of the first embodiment roughly comprises a plate-shaped part 11, and a projecting part 12 provided so as to project from the plate-shaped part 11 (see FIGS. 1A, 1B, 2A, 2B, and 2C). The plate-shaped part 11 and the projecting part 12 are integrally provided using, e.g., die casting, or another technique. The laser holder 1 is preferably formed of a material having good heat dissipation characteristics; and is formed using, e.g., zinc, aluminum, an alloy thereof, or another metal.

An insertion port 111 that is substantially rectangular as viewed from above is formed substantially in the center part of the plate-shaped part 11 in order for the semiconductor laser 5 to be inserted. The insertion port 111 is a through-hole that passes through the plate-shaped part 11 in the thickness direction. The insertion port 111 is configured such that the sides in the lengthwise direction are not mutually parallel, but are rather diagonally sloped as viewed with reference to the plate-shaped part 11, which is similarly provided in a substantially rectangular shape as viewed from above. This configuration was determined as a compromise relative to the configuration of the optical pickup on which the laser holder 1 is to be attached, and the orientation of the insertion port 111 may be suitably modified in accordance with the configuration of the optical pickup.

A variety of threaded holes 112 (so described because there are different sizes and shapes) are provided to each of the four corners of the plate-shaped part 11 so that the laser holder 1 can be screwed into a base (not shown) of the optical pickup.

The projecting part 12 is provided in a position that corresponds to the insertion port 111 provided in the plate-shaped part 11. The projecting part 12 is provided such that the external shape thereof is, broadly speaking, a substantially cylindrical post. The projecting part 12 provided in the shape of a substantially cylindrical post is provided with a space 121 for forming an insertion part 10, into which the semiconductor laser 5 is inserted, together with the insertion port 111.

Provided to the insertion part 10 is a wall surface part 101, against which is pressed the metal frame part 51 of the semiconductor laser 5 inserted into the insertion part 10 (more precisely, the reverse side of the surface on which the semiconductor laser chip 52 is mounted). The wall surface part 101 is provided so as to extend perpendicularly from one of the two long sides constituting the peripheral edge of the insertion port 111.

A support part 102 for supporting the semiconductor laser 5 inserted into the insertion part 10 is provided to the distal end of the insertion part 10 (i.e., the bottom surface of the projecting part 12). A through-hole 102a through which laser light emitted from the semiconductor laser 5 inserted into the insertion part 10 is emitted to the exterior is formed in the support part 102.

Two aperture parts 103a, 103b provided substantially in symmetry are provided on either side of an un-notched region 122 (see FIGS. 1B and 2C) on the side surface of the projecting part 12 provided in the shape of a substantially cylindrical post. The resin part 53 of the semiconductor laser 5 inserted into the insertion part 10 can be pushed from the exterior and pressed against the wall surface part 101 due to the presence of these two aperture parts 103a, 103b. These two aperture parts 103a, 103b are examples of the aperture part that allows the resin part to be pushed from the exterior in the present invention, and are hereinbelow referred to as aperture parts 103a, 103b for pushing.

The unnotched region 122 is provided to inhibit wobble of the semiconductor laser 5 inserted into the insertion part 10. As described below, the semiconductor laser 5 is configured so as to be securely bonded to the laser holder 1, and the phrase "inhibit wobbling" used herein is an effect that envisions an unsecured state (a state midway through manufacturing).

Figure 3:
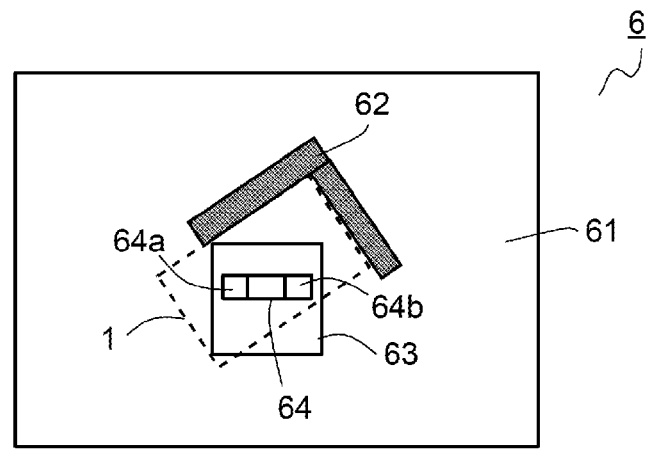
FIG. 3 is a schematic plan view of a case in which the installation device is viewed from above, the installation device being used when the semiconductor laser is to be installed in the laser holder of the first embodiment.

There shall now be described an example of the procedure for installing the semiconductor laser 5 in the laser holder 1 provided as described above. FIG. 3 is a schematic plan view of the case in which the installation device is viewed from above, the installation device being used when the semiconductor laser is installed in the laser holder of the first embodiment. An installation device 6 has a platform 61 on which the laser holder 1 (indicated by a broken line in FIG. 3) is placed, as shown in FIG. 3.

A positioning part 62 configured in the form of a tilted L is provided so that the laser holder 1 can be positioned and arranged on the platform 61. In FIG. 3, the laser holder 1 positioned by the positioning part 62 is indicated by a broken line. A window part 63 composed of a through-hole that passes through the platform 61 is provided to the platform 61. The projecting part 12 of the laser holder 1 thus positioned and arranged by the positioning part 62 is positioned inside the window part 63.

Figure 4:
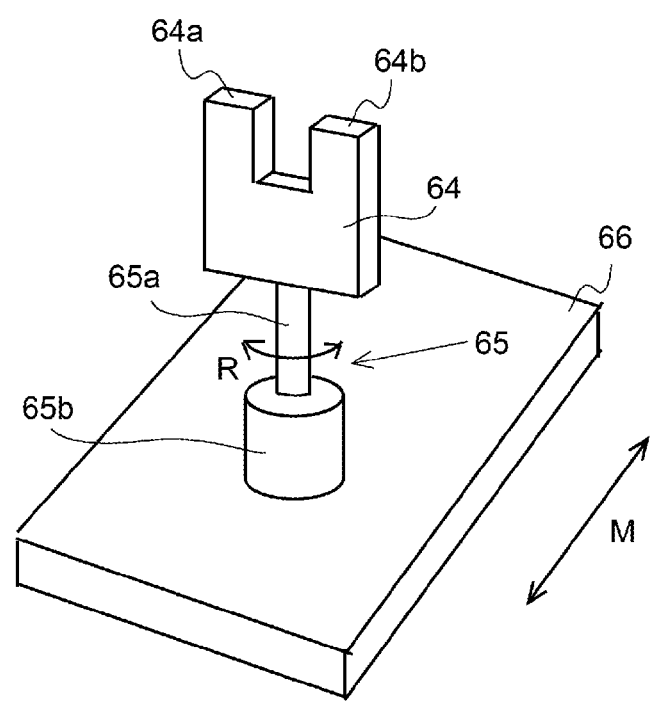
FIG. 4 is a diagram for illustrating the pushing member provided to the installation device used when the semiconductor laser is to be installed in the laser holder of the first embodiment.

A pushing member 64 used for pushing the resin part 53 of the semiconductor laser 5 inserted into the insertion part 10 of the laser holder 1 is present inside the window part 63. FIG. 4 is a diagram for illustrating the pushing member provided to the installation device, which is used when the semiconductor laser is to be installed in the laser holder of the first embodiment; and is a schematic perspective view showing the pushing member and peripheral configuration thereof.

The pushing member 64 is a plate-shaped member provided substantially in a U-shape, as shown in FIG. 4. The pushing member 64 can be caused to rotate by a rotation mechanism 65 composed of a rod 65a that is connected to the lower side of the pushing member 64, and a support member 65b for rotatably supporting the rod 65a. A stage 66 on which the pushing member 64 and the rotation mechanism 65 are mounted, and which is provided to the lower side of the platform 61, can be moved in parallel fashion along a guide (not shown).

The directions R in which the pushing member 64 is caused to rotate by the rotation mechanism 65 are clockwise and counter-clockwise in FIG. 3. The direction M in which the stage 66 moves in parallel is the vertical direction in FIG. 3.

The pushing member 64 is arranged in a position that is not in contact with the semiconductor laser 5 inserted into the insertion part 10 of the laser holder 1 at the time that the laser holder 1 is arranged in a predetermined position on the platform 61 (a position determined by the positioning part 62). When the laser holder 1 is arranged in a predetermined position, the stage 66 is moved in a parallel fashion, whereby the pushing member 64 also moves in parallel fashion and two ends 64a, 64b of the "U" shape of the pushing member 64 make contact with the resin part 53 of the semiconductor laser 5 via the aperture parts 103a, 103b for pushing. The pushing member 64 furthermore moves in parallel fashion in a state of contact, whereby the reverse surface of the metal frame part 51 of the semiconductor laser 5 (the surface of the side on which the semiconductor laser chip 52 is not mounted) is pressed against the wall surface part 101 of the insertion part 10.

Figure 5A:
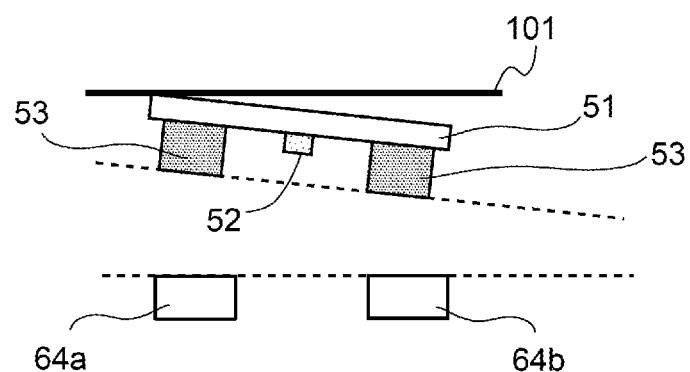
FIG. 5A is a schematic diagram for illustrating the effect of the rotation mechanism provided to the installation device used when the semiconductor laser is to be installed in the laser holder of the first embodiment, showing a state prior to the pushing member making contact with the resin part of the semiconductor laser.
Figure 5B:
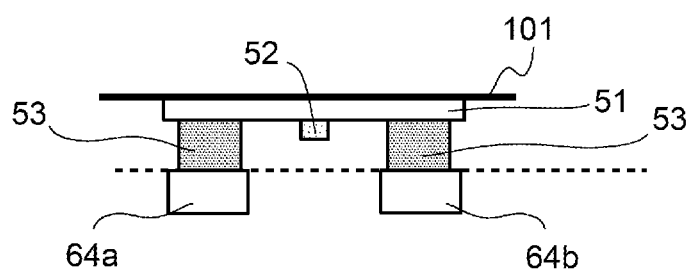
FIG. 5B is a schematic diagram for illustrating the effect of the rotation mechanism provided to the installation device used when the semiconductor laser is to be installed in the laser holder of the first embodiment, showing a state in which the pushing member has made contact with the resin part of the semiconductor laser and the semiconductor laser has been pressed against the wall surface part.

FIGS. 5A and 5B are schematic diagrams for illustrating the effect of the rotation mechanism provided to the installation device, which is used when the semiconductor laser is to be installed in the laser holder of the first embodiment, wherein FIG. 5A shows a state prior to the pushing member making contact with the resin part of the semiconductor laser, and FIG. 5B shows a state in which the pushing member has made contact with the resin part of the semiconductor laser and the semiconductor laser has been pressed against the wall surface part.

The semiconductor laser 5 to be inserted into the insertion part 10 of the laser holder 1 is not press-fitted, and may have a slight tilt in relation to the wall surface part 101 on being inserted into the insertion part 10. This state is shown in FIG. 5A. In this case, only one end 64b of the "U" shape of the pushing member 64 (a representation envisioning the state of FIG. 5A) pushes the resin part 53 of the semiconductor laser 5, and it is possible that a biased force will be applied to the semiconductor laser 5 in the case that the installation device 6 does not have a rotation mechanism 65.

In this regard, the resin part 53 of the semiconductor laser 5 can be pushed by the two ends 64a, 65b of the "U" shape of the pushing member 64 when a rotation mechanism 65 is provided as in the installation device 6 of the present embodiment, even when the semiconductor laser 5 is inserted at a tilt in the insertion part 10 as shown in FIG. 5A. Accordingly, the resin part 53 of the semiconductor laser 5 can be uniformly pushed from the left and right, as shown in FIG. 5B, when the semiconductor laser 5 is pressed against the wall surface part 101 using the pushing member 64. As a result, the reverse side of the metal frame part 51 of the semiconductor laser 5 can be reliably pressed flush against the wall surface part 101.

The installation device 6 described above is given merely by way of example. The sliding of the stage 66 in the installation device 6 may be carried out using the urging force of an urging member. The work of pressing the semiconductor laser 5 to the wall surface part 101 using the pushing member 64 is thereby facilitated. In the present embodiment, the stage 66 is configured to move in relation to the platform 61, but the platform 61 may move in relation to the stage 66.

Figure 6:
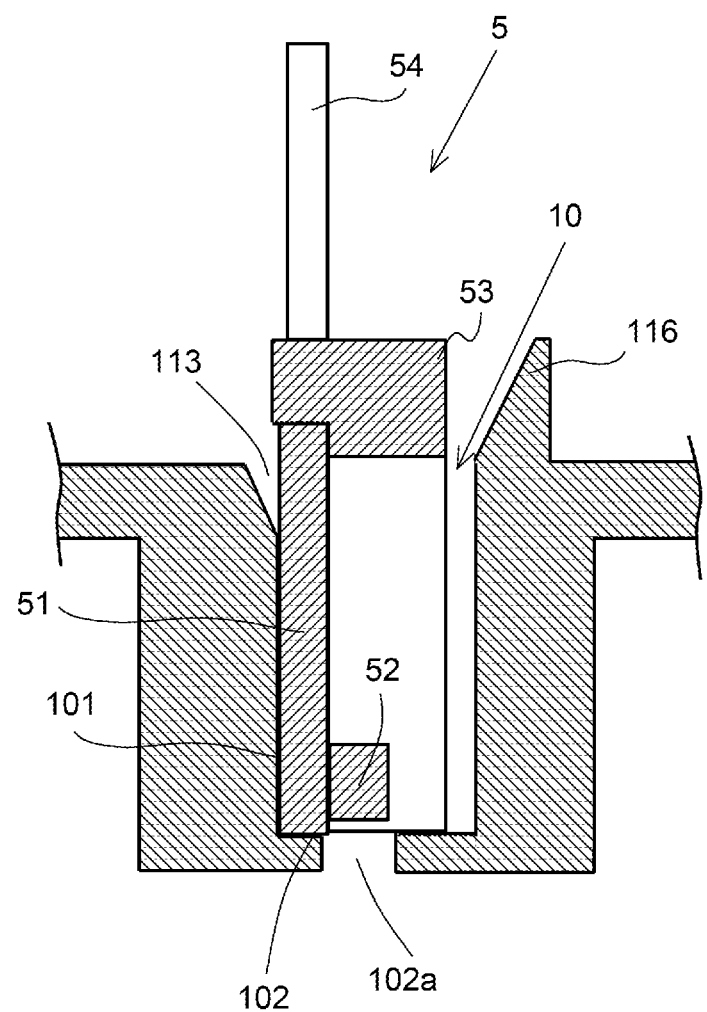
FIG. 6 is a schematic cross-sectional view showing a state in which the semiconductor laser has been pressed against the wall surface part of the laser holder of the first embodiment.

FIG. 6 is a schematic cross-sectional view showing the state in which the semiconductor laser has been pressed against the wall surface part of the laser holder of the first embodiment. FIG. 6 depicts a cross-section envisioned at position A-A of FIG. 2A. The semiconductor laser 5, in which the resin part 53 has been pushed by the pushing member 64, assumes a state in which the reverse surface of the metal frame part 51 has made firm contact with the wall surface part 101 of the insertion part 10, i.e., a state in which the heat generated by the semiconductor laser chip 52 is readily dissipated to the laser holder 1, as shown in FIG. 6.

The semiconductor laser 5 is temporarily secured in the laser holder 1 in a short period of time (e.g., not exceeding one minute) using a UV-curable adhesive when the resin part 53 of the semiconductor laser 5 has been pushed by the pushing member 64 to yield the state shown in FIG. 6. After this temporary securing, the pushing performed by the pushing member 64 is canceled. The UV-curable adhesive does not necessarily have excellent heat resistance, and the semiconductor laser 5 is therefore permanently secured to the laser holder 1 thereafter using a thermoset adhesive. Specifically, the thermoset adhesive is applied, and heat at a predetermined temperature is then applied to the adhesive for a predetermined length of time. The thermoset adhesive is thereby cured.

It is apparent that the semiconductor laser 5 may be immediately secured to the laser holder 1 using a thermoset adhesive without temporary securing using a UV-curable adhesive. In this case, a state of pushing must be maintained by the pushing member 64 until the thermoset adhesive cures. Accordingly, manufacturing efficiency can be improved by first performing temporary securing using a UV-curable adhesive, as in the present embodiment.

With the laser holder 1 of the first embodiment, three concave parts 113, 114, 115 are arranged in a row at the peripheral edge of the insertion port 111 so as to be adjacent to the wall surface part 101. The first concave part 113, which is positioned centrally with respect to the three concave parts 113 to 115, is used as an adhesive filling part to be filled with a UV-curable adhesive. The second concave part 114 and the third concave part 115 arranged on either side of the first concave part 113 are used as adhesive filling parts to be filled with a thermoset adhesive. When provided in advance, these concave parts 113 to 115 to be filled by adhesive become guides for adhesion sites during bonding work, facilitating the work.

The method for arranging the concave parts serving as guides for the bonding sites and the shape of the concave parts can be suitably modified; the configuration of the present embodiment merely being given by way of example.

In the laser holder 1 of the first embodiment, a convex part 116 is formed at the peripheral edge of the insertion port 111 on the side facing the wall surface part 101 so as to follow the peripheral edge of the insertion port. The convex part 116 is provided as a countermeasure for dust, and the possibility of dust infiltrating toward the semiconductor laser chip 52 of the semiconductor laser 5 inserted into the insertion part 10 can be reduced by the convex part 116. However, the convex part 116 is not essential; it is also possible to use a configuration in which the convex part 116 is not provided.

The convex part 116 is preferably the same length or greater than the long side constituting the peripheral edge of the insertion port 111. The use of such a configuration makes it possible to reduce the possibility that the semiconductor laser chip 52 will collide with the two end parts of the convex part 116 when the semiconductor laser 5 is inserted into the insertion part 10. The surface of the convex part 116 on the side oriented toward the semiconductor laser 5 when the semiconductor laser 5 is inserted into the insertion part 10 is preferably a sloped surface that increases in distance from the semiconductor laser 5 toward the upper side of the convex part 116. With this configuration, it is possible to reduce the possibility that the semiconductor laser chip 52 will collide with and get damaged by the convex part 116 when the semiconductor laser 5 is inserted into the insertion part 10.

In the laser holder 1 configured in the manner described above, the metal frame part 51 of the semiconductor laser 5 can be caused to make firm contact with the metal laser holder 1 without the semiconductor laser 5 being press-fitted into the laser holder 1. Accordingly, there is little possibility that the semiconductor laser 5 will be damaged when attached to the laser holder 1. Further advantages are presented in terms of cost and ease of processing during manufacture because there is no need to provide heat-dissipating grease, or indeed plate springs or other urging members to ensure heat dissipation characteristics.

Figure 7:
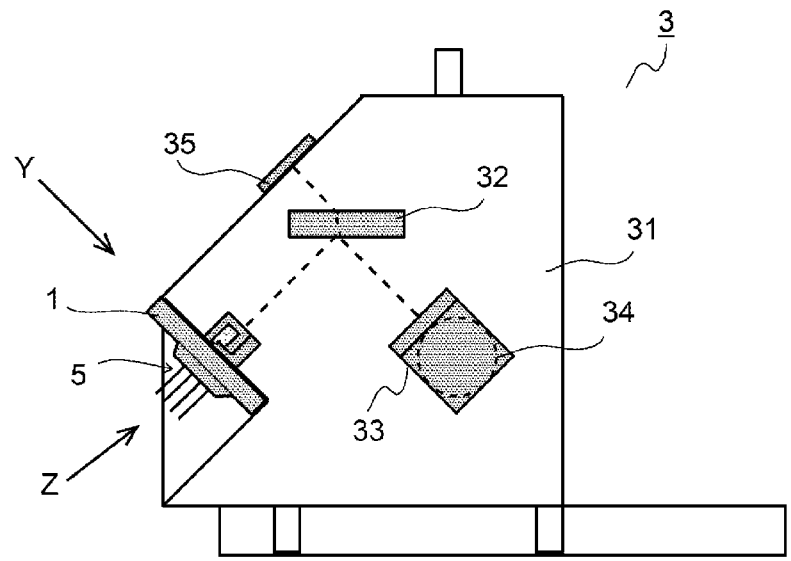
FIG. 7 is a plan view showing the schematic configuration of an optical pickup provided with the laser holder of the first embodiment.
Figure 8A:
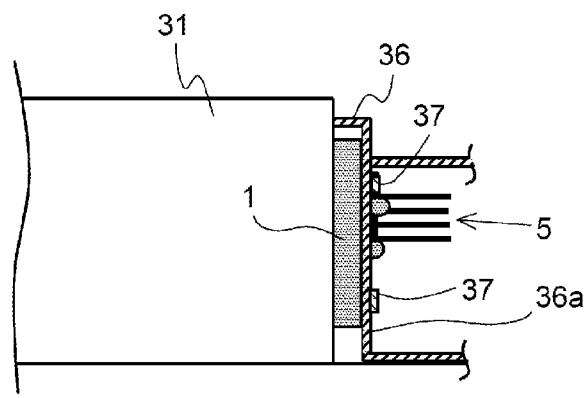
FIG. 8A is a diagram for illustrating the relationship between the laser holder and the metal cover in the case that the metal cover has been placed on the optical pickup shown in FIG. 7, and is a schematic plan view showing the configuration of the laser holder periphery when viewed along the arrow Y of FIG. 7.
Figure 8B:
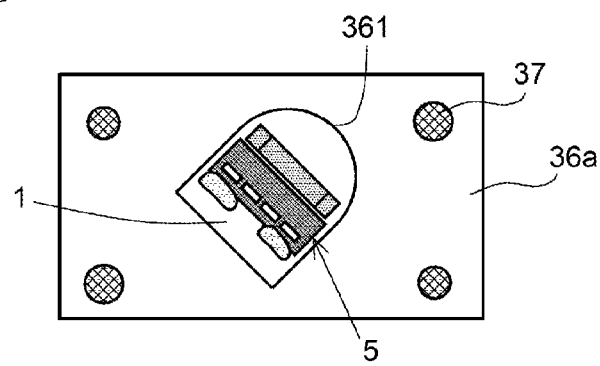
FIG. 8B is a diagram for illustrating the relationship between the laser holder and the metal cover in the case that the metal cover has been placed on the optical pickup shown in FIG. 7, and is a schematic plan view showing the configuration of the laser holder periphery when viewed along the arrow Z of FIG. 7.

The optical pickup provided to the laser holder 1 of the first embodiment configured in the manner described above will now be described with reference to FIGS. 7, 8A, and 8B. FIG. 7 is a plan view showing the schematic configuration of an optical pickup provided with the laser holder of the first embodiment. FIGS. 8A and 8B are diagrams for illustrating the relationship between the laser holder and the metal cover in the case that the metal cover has been placed on the optical pickup shown in FIG. 7. FIG. 8A is a schematic plan view showing the configuration of the laser holder periphery when viewed along the arrow Y of FIG. 7. FIG. 8B is a schematic plan view showing the configuration of the laser holder periphery when viewed along the arrow Z of FIG. 7.

An optical pickup 3 of the present embodiment has a base member 31 on which a laser holder 1 (in which a semiconductor laser 5 is installed), optical members 32 to 34, a light-receiving element 35, and the like are mounted, as shown in FIG. 7. The optical members mounted on the base member 31 include a beam splitter 32, a rising mirror 33, and an objective lens 34. In FIG. 7, the objective lens 34 is arranged on the depthwise distant side in the direction perpendicular to the plane of the drawing (the depthwise distant side relative to the plane of the drawing), and is therefore shown by a broken line.

In the optical pickup 3, a portion of the laser light emitted from the semiconductor laser 5 is reflected by the beam splitter 32. The reflected laser light is reflected by the rising mirror 33, and the direction in which the light propagates is converted to a direction perpendicular to an information recording surface of an optical disk (not shown, but arranged on the depthwise distant side relative to the plane of the drawing in FIG. 7). The laser light reflected by the rising mirror 33 is focused by the objective lens 34 onto the information recording surface of the optical disk.

The objective lens 34 is mounted on the base member 31 in a state of being mounted on an objective lens actuator (not shown). The objective lens actuator is a device that allows the objective lens 34 to move in the focus direction and the tracking direction. Here, the focus direction is the direction perpendicular to the information recording surface of the optical disk (the direction perpendicular to the plane of the drawing in FIG. 7), and the tracking direction is the direction parallel to the radial direction of the optical disk (the left/right direction in FIG. 7). Using the objective lens actuator makes it possible to control the focal position of the objective lens 34 so that it constantly lies on the information recording surface (focus control), and makes it possible to control the light spot focused on the information recording surface by the objective lens 34 so that it constantly follows the tracks of the optical disk (tracking control).

The laser light focused on the information recording surface of the optical disk by the objective lens 34 is reflected by the information recording surface. The reflected light (return light) passes the objective lens 34, the rising mirror 33, and the beam splitter 32 in the stated order; and arrives at the light-receiving element 35. The light-receiving element 35 functions as photoelectric conversion means for converting into electric signals light signals received in a light-receiving region. The electric signals outputted from the light-receiving element 35 undergo signal processing to become playback signals, servo signals, and the like.

In the present embodiment, the semiconductor laser 5 is configured as a two-wavelength laser for emitting DVD laser light and CD laser light, as described above. Accordingly, a DVD-light-receiving region and a CD-light-receiving region are provided to the light-receiving element 35.

In the optical pickup 3, a metal cover is placed over the base member 31 in order to protect the optical members mounted on the base member 31 from dust. The metal cover also serves to dissipate heat generated by the semiconductor laser chip 52. A further description will be provided with reference to FIGS. 8A and 8B.

The metal cover 36 which functions, e.g., as a dust guard or the like is configured with a portion thereof bent, the bent part 36a lying over the laser holder 1 attached to the optical pickup 3 (see FIG. 8A). Threaded holes are provided in the four corners of the substantially rectangular bent part 36a (see FIG. 8B) lying over the laser holder 1. Screws 37 are securely fitted in the threaded holes, whereby the metal cover 36 is secured to the base member 31. A notch 361 is provided in the center of the bent part 36a of the metal cover 36 in order to avoid interference with the portion that projects from the laser holder 1 of the semiconductor laser 5.

When the metal cover 36 is to be secured to the base member 31 using the screws 37, the threaded holes provided to the bent part 36a and the threaded holes 112 of the laser holder 1 (e.g., see FIGS. 1A and 2A) are adjusted so as to lie over one another. The metal cover 36 is secured to the base member 31 together with the laser holder 1 in a state in which the bent part 36a lies over the laser holder 1. Accordingly, the metal cover 36 and the laser holder 1 are in a state of tight contact, and heat generated by the laser holder 1 is efficiently dissipated using the metal cover 36. As described above, the laser holder 1 is capable of efficiently dissipating the heat generated by the semiconductor laser 5. Additionally, the heat in the laser holder 1 can be dissipated with good efficiency by the metal cover 36. Accordingly, performance for dissipating the heat generated by the semiconductor laser 5 can be sufficiently ensured in the optical pickup 3.

The bent part 36a of the metal cover 36 can be configured so that there will be a sufficient area of contact with the laser holder 1, and the size and shape of the bent part 36a can be suitably modified.

Second Embodiment

The laser holder of a second embodiment shall now be described. Like the laser holder 1 of the first embodiment, the laser holder of the second embodiment is a laser holder suited for use with frame-type semiconductor lasers. The description below assumes that the semiconductor laser installed in the laser holder of the second embodiment is the same as that described in the first embodiment.

Figure 9A:
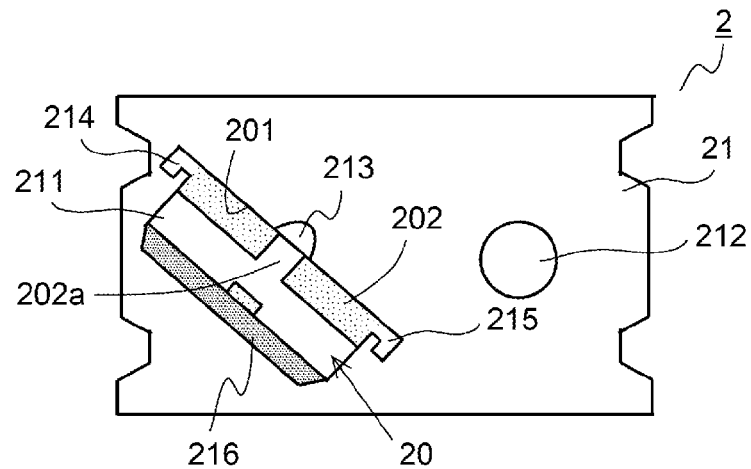
FIG. 9A is a schematic top view for illustrating the laser holder of the second embodiment.
Figure 9B:
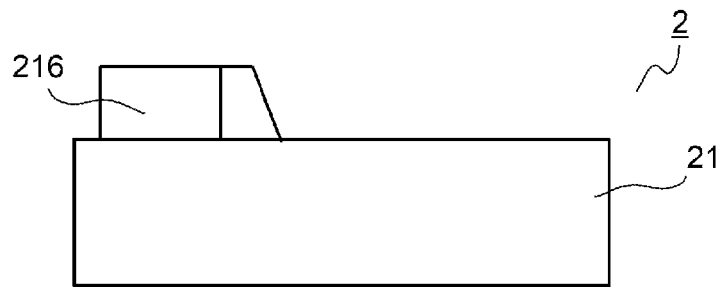
FIG. 9B is a schematic side view for illustrating the laser holder of the second embodiment.
Figure 9C:
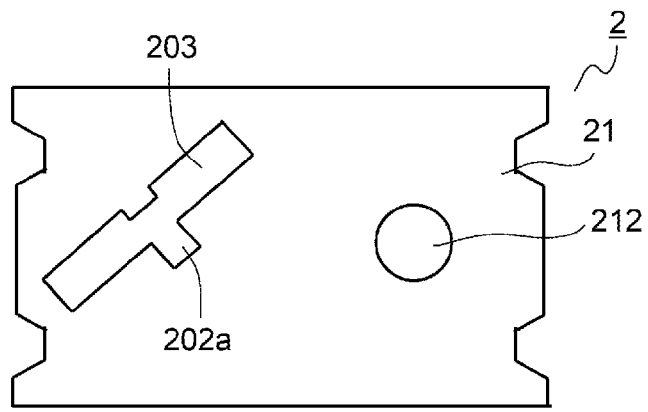
FIG. 9C is a schematic bottom view for illustrating the laser holder of the second embodiment.

FIGS. 9A, 9B, and 9C are schematic diagrams for describing the laser holder of the second embodiment, wherein FIG. 9A is a top view, FIG. 9B is a side view, and FIG. 9C is a bottom view. The laser holder 2 of the second embodiment has a substantially rectangular-parallelepiped-shaped main body 21, as shown in FIGS. 9A, 9B, and 9C. A material having good heat dissipation characteristics as with the laser holder 1 of the first embodiment is selected as the material of the main body 21; and, e.g., zinc, aluminum, an alloy thereof, or another metal is selected.

An insertion port 211 that is substantially rectangular as viewed from above is formed near one end part of the main body 21 in the lengthwise direction in order for the semiconductor laser 5 to be inserted, as shown in FIG. 9A. A substantially rectangular internal space is provided below the insertion port 211, and an insertion part 20 into which the semiconductor laser 5 is to be inserted is formed by the internal space and the insertion port 211. A threaded hole 212 is provided near the other end of the main body 21 in the lengthwise direction so that the laser holder 2 can be screwed to a base (not shown) of the optical pickup.

The insertion port 211 is not in a relationship in which the sides of the insertion port 211 and the main body 21 in the lengthwise direction are mutually parallel, and is configured so as to be diagonally tilted when viewed with reference to the main body 21, which is similarly provided in a substantially rectangular shape. The reason for this is the same as that of the case of the laser holder 1 of the first embodiment, and the orientation of the insertion port 211 may be suitably modified.

A wall surface part 201, against which the metal frame part 51 of the semiconductor laser 5 (more precisely, the reverse side of the surface on which the semiconductor laser chip 52 is mounted) is pressed when inserted into the insertion part 20 is provided to the insertion part 20. The wall surface part 201 is provided so as to extend in the direction perpendicular from one of the two long sides constituting the peripheral edge of the insertion port 211 that is substantially rectangular as viewed from above.

A support part 202 for supporting the semiconductor laser 5 inserted into the insertion part 20 is provided to the distal end of the insertion part 20 (i.e., the bottom of the main body 21). The support part 202 projects from the wall surface part 201 in a substantially perpendicular direction. A notch 202a for allowing laser light emitted from the semiconductor laser 5 inserted into the insertion part 20 to be emitted to the exterior is formed in the support part 202.

An aperture part 203 that is substantially rectangular as viewed from above is formed in the insertion part 20 (i.e., in the bottom surface of the main body 21) so as to face the insertion port 211 (see FIG. 9C). Due to the presence of the aperture part 203, the resin part 53 of the semiconductor laser 5 inserted into the insertion part 20 is pushed from the exterior by a pushing member, and the semiconductor laser 5 can be pressed against the wall surface part 201. The aperture part 203 is an example of the aperture part that allows the resin part to be pushed from the exterior in the present invention, and may hereinbelow be expressed as the aperture part 203 for pushing.

In the laser holder 2 of the second embodiment, three concave parts 213, 214, 215 to be filled by an adhesive are provided to the peripheral edge of the insertion port 211 for the same purpose as that of the laser holder 1 of the first embodiment. In the laser holder 2 of the second embodiment, a convex part 216 is formed at the peripheral edge of the insertion port 211 so as to follow the peripheral edge of the insertion port on the side facing the wall surface part 201 for the same purpose as that of the laser holder 1 of the first embodiment.

Figure 10A:
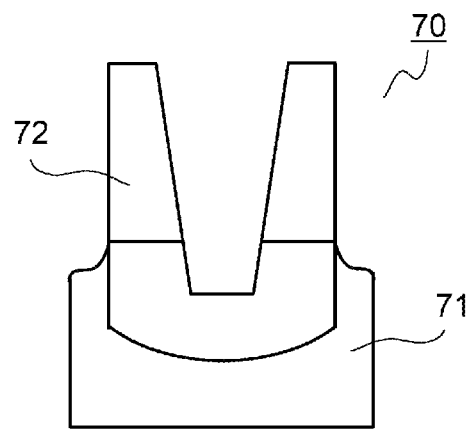
FIG. 10A is a schematic front view showing an example of the pushing member that is used when the semiconductor laser is to be installed in the laser holder of the second embodiment.
Figure 10B:
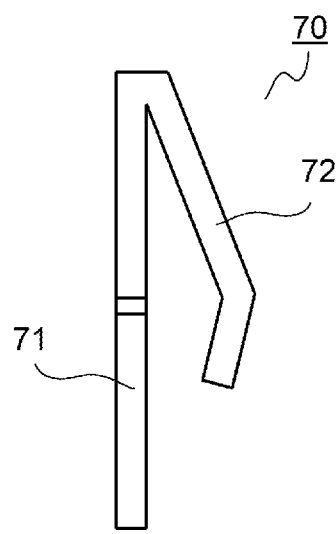
FIG. 10B is a schematic side view showing an example of the pushing member that is used when the semiconductor laser is to be installed in the laser holder of the second embodiment.
Figure 11:
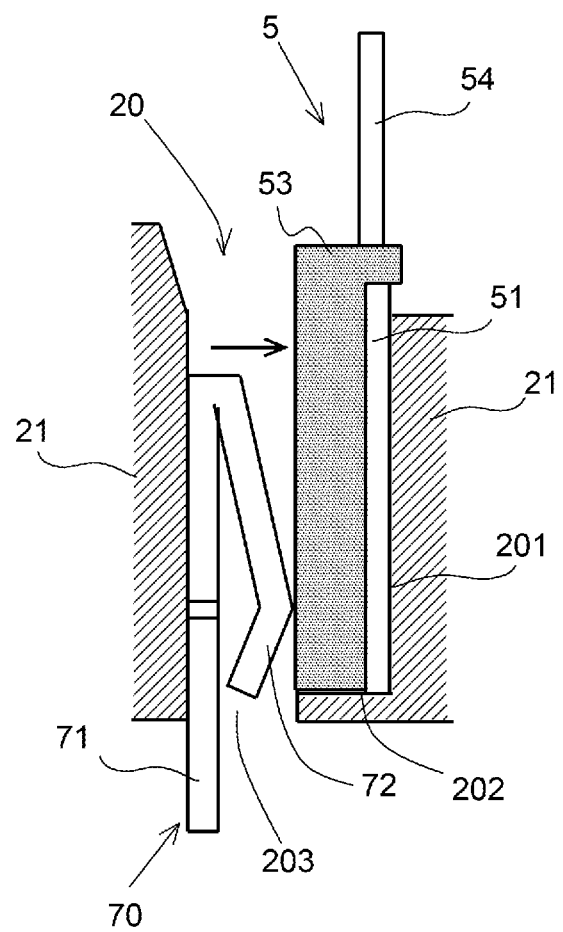
FIG. 11 is a schematic side view showing the appearance inside the insertion part in a state occurring during the installation of the semiconductor laser in the laser holder of the second embodiment.

Described next with reference to FIGS. 10A, 10B, and 11 is an example of the procedure by which the semiconductor laser 5 is installed in the laser holder 2 provided in the manner described above. FIGS. 10A and 10B are schematic plan views showing an example of the pushing member that is used when the semiconductor laser is to be installed in the laser holder of the second embodiment. FIG. 10A is front view and FIG. 10B is a side view. FIG. 11 is a schematic side view showing the appearance inside the insertion part in a state during the installation of the semiconductor laser in the laser holder of the second embodiment.

The pushing member 70 shown FIGS. 10A and 10B is obtained, e.g., by bending and forming sheet metal, and has a support part 71 and an elastic part 72. The pushing member 70 is used in a state in which, e.g., the support part 71 has been secured to a platform (not shown).

When the semiconductor laser 5 is to be installed in the laser holder 2, the pushing member 70 is inserted into the insertion part 20 of the laser holder 2 via the aperture part 203 for pushing. At this time, the pushing member 70 is inserted so that the elastic part 72 faces the semiconductor laser 5 that is to be inserted in the insertion part 20. The insertion part 20 of the laser holder 2 must be a size that allows the semiconductor laser 5 and the pushing member 70 to be inserted (formation of sufficient space).

When the pushing member 70 is inserted into the insertion part 20, the semiconductor laser 5 is subsequently inserted into the insertion part 20. The semiconductor laser 5 to be inserted into the insertion part 20 is inserted so that the resin part 53 faces the pushing member 70. The resin part 53 of the semiconductor laser 5 is pushed by the elastic part 72 of the pushing member 70 during insertion (pushed in the direction of the arrow of FIG. 11). In other words, when inserted into the insertion part 20, the semiconductor laser 5 is pressed against the wall surface part 201 by the pushing member 70.

In this state, the semiconductor laser 5 is temporarily secured to the laser holder 2 in a short period of time (e.g., time that does not exceed one minute) using a UV-curable adhesive. After this temporary securing, the pushing by the pushing member 70 is canceled (the pushing member 70 is removed from the insertion part 20). Since the UV-curable adhesive does not necessarily have excellent heat resistance, the semiconductor laser 5 is permanently secured to the laser holder 2 thereafter using a thermoset adhesive. Specifically, the thermoset adhesive is applied, and heat at a predetermined temperature is then applied to the adhesive for a predetermined length of time.

In the laser holder 2 configured in the manner described above, the metal frame part 51 of the semiconductor laser 5 can be caused to make firm contact with the laser holder 2 without the semiconductor laser 5 being press-fitted into the laser holder 2. Accordingly, the possibility that the semiconductor laser 5 will be damaged is low when the semiconductor laser 5 is attached to the laser holder 2. Advantages are presented in terms of cost and ease of processing during manufacture because there is no need to provide heat-dissipating grease, or indeed plate springs or other urging members to ensure heat dissipation characteristics.

Like the laser holder 1 of the first embodiment, the laser holder 2 of the second embodiment may also be mounted on the base member of the optical pickup. In this case, heat dissipation is improved by using a metal cover for covering the optical members used in the optical pickup.

The embodiments described above are merely examples of the present invention; the laser holder and optical pickup of the present invention are not limited to the configurations described above.

For example, the external shape of the projecting part 12 is that of a substantially cylindrical post in the first embodiment described above. However, the present invention can also be applied in cases where the external shape of the projecting part is a quadrangular post, or another shape. However, a configuration such as that in the first embodiment is convenient because in an optical pickup provided so that a CAN-package semiconductor laser can be directly attached, it will be possible to employ a laser holder in which a frame-type semiconductor laser has been installed as a replacement component for a CAN-package semiconductor laser.

In the second embodiment described above, the pushing member 70 is an elastic member, but it is also possible to use a configuration that does not have an elastic member. In this case, the pushing member 70 may be, e.g., slidably moved as the first embodiment.

The second embodiment described above is configured so that the aperture part of the present invention is provided in a position that faces the insertion port 211. However, the present invention is not limited to this configuration. The aperture part through which the resin part can be pushed from the exterior may be provided to the side surface or the like of the main body 21.

In the embodiments described above, the optical pickup is compatible with DVDs and CDs, but it shall be apparent that the types of optical disks that are compatible with the optical pickup to which the present invention has been applied is not limited to those described in the present embodiment.

The present invention is favorable for an optical pickup in which a frame-type semiconductor laser is used.

What is claimed is:

1. A laser holder for holding a semiconductor laser, the semiconductor laser having a frame part in which a semiconductor laser chip is mounted, and a surrounding part provided so as to surround the semiconductor laser chip, the laser holder comprising:
    an insertion part into which the semiconductor laser is inserted;
    wherein the insertion part is provided with
    an insertion port through which the semiconductor laser is inserted,
    an aperture part provided in a surface different from a surface in which the insertion port is provided, wherein through the aperture part the surrounding part of the semiconductor laser is exposed to air, and
    an unnotched region is provided so as to divide the aperture part.

2. The laser holder of claim 1,
    wherein the insertion part is formed by
    a plate-shaped part in which the insertion port is provided, and
    a projecting part provided so as to protrude from the plate-shaped part, with the aperture part formed in a side surface of the projecting part.

3. The laser holder of claim 2, wherein the unnotched region is contiguous with the plate-shaped part.

4. The laser holder of claim 1, wherein the frame part has a hook part that engages with part of the insertion part.

5. The laser holder of claim 1, wherein a convex part is formed on a peripheral edge of the insertion port.

6. The laser holder of claim 5, wherein the convex part includes an inclined surface.

7. The laser holder of claim 1, wherein the insertion part is furthermore provided with a support part for supporting a distal end of the semiconductor laser inserted into the insertion part.

8. The laser holder of claim 1, wherein a concave part to be filled with an adhesive is formed on a peripheral edge of the insertion port.

9. An optical pickup comprising the laser holder of claim 1.

10. The optical pickup of claim 9, comprising:
    a base member on which the laser holder holding the semiconductor laser, and an optical member are mounted; and
    a metal cover for covering the optical member mounted on the base member,
    wherein the laser holder and the metal cover are secured in a state of contact.

\* \* \* \* \*